United States Patent
Hintzen et al.

(10) Patent No.: US 7,485,243 B2
(45) Date of Patent: Feb. 3, 2009

(54) LUMINESCENT MATERIAL AND LIGHT EMITTING DIODE USING THE SAME

(75) Inventors: Hubertus T. Hintzen, Eindhoven (NL); Yuan-Qiang Li, Eindhoven (NL)

(73) Assignee: Osram Opto Semiconductors GmbH, Regensburg (DE)

( * ) Notice: Subject to any disclaimer, the term of this patent is extended or adjusted under 35 U.S.C. 154(b) by 763 days.

(21) Appl. No.: 10/496,560

(22) PCT Filed: Sep. 23, 2003

(86) PCT No.: PCT/EP03/10598

§ 371 (c)(1),
(2), (4) Date: Jan. 3, 2005

(87) PCT Pub. No.: WO2004/029177

PCT Pub. Date: Apr. 8, 2004

(65) Prior Publication Data

US 2006/0033081 A1    Feb. 16, 2006

(51) Int. Cl.
- C09K 11/64 (2006.01)
- C09K 11/55 (2006.01)
- H01L 33/00 (2006.01)

(52) U.S. Cl. .............................. 252/301.4 F; 313/503; 257/98

(58) Field of Classification Search ............ 252/301.4 F; 313/503; 257/98

See application file for complete search history.

(56) References Cited

U.S. PATENT DOCUMENTS

| 6,278,135 | B1 | 8/2001 | Srivastava et al. |
| 6,649,946 | B2 | 11/2003 | Bogner et al. |
| 7,015,510 | B2 | 3/2006 | Srivastava et al. |
| 7,351,356 | B2* | 4/2008 | Delsing et al. ........ 252/301.4 S |
| 2002/0043926 | A1* | 4/2002 | Takahashi et al. ........... 313/503 |

FOREIGN PATENT DOCUMENTS

| EP | 0 155 047 A | 9/1985 |
| EP | 1 104 799 A | 6/2001 |
| EP | 1 193 306 A | 4/2002 |
| GB | 1 112 777 A | 5/1968 |
| WO | WO 2006/022793 | 3/2006 |

OTHER PUBLICATIONS

Rainer Lauterbach et al.", Synthese, Kristallstruktur und Eigenschaften eines neuen Sailons-SRSiAl$_2$O$_3$N$_2$", Z. anorg. Allg. Chem. 624, pp. 1154-1158, (1998).
J.W.H. van Krevel et al., "Luminescence Properties of Terbium-, Cerium-, or Europium-Doped α-Sialon Materials", Journal of Solid State Chemistry, vol. 165, pp. 19-24, Apr. 2002.
Ron-Jun Xie et al., "Preparation and Luminescence Spectra of Calcium- and Rare-Earth (R = Eu, Tb and Pr)-Codoped α-SiALON Ceramics", Journal of American Ceramic Society, vol. 85, pp. 1229-1234, May 2002.

* cited by examiner

*Primary Examiner*—C. Melissa Koslow
(74) *Attorney, Agent, or Firm*—Cohen Pontani Lieberman & Pavane LLP

(57) ABSTRACT

UV-blue excitable luminescent material consisting of a Eu-doped oxynitride host lattice with general composition $MAl_{2-x}Si_xO_{4-x}N_x$, wherein M is at least one of an alkaline earth metal chosen from the group Ca, Sr, Ba.

20 Claims, 5 Drawing Sheets

US 7,485,243 B2

LUMINESCENT MATERIAL AND LIGHT EMITTING DIODE USING THE SAME

RELATED APPLICATIONS

This is a U.S. national stage of application No. PCT/EP03/10598, filed on 9 Nov. 2001.

This patent application claims the priority of European patent application 02021177.7 filed 24 Sep. 2002, the disclosure content of which is hereby incorporated by reference.

TECHNICAL FIELD

This invention relates to a luminescent material which is excitable in the UV-blue part of the spectral region, and more particularly, but not exclusively to a phosphor for light sources, preferably for Light Emitting Diodes (LED). The phosphor belongs to the class of rare-earth activated silicon oxynitrides.

BACKGROUND ART

So far white LEDs were realized by combining a blue-emitting diode with a yellow emitting phosphor. Such a combination has a poor color rendition, which, however, can be improved significantly by using a red-green-blue system (RGB). Such a system uses for example a red and blue emitter in combination with a green-emitting aluminate phosphor, like $SrAl_2O_4$:Eu or $BaAl_2O_4$:Eu, with the possible addition of Mn to Eu, whose emission maximum is around 520 nm, see U.S. Pat. No. 6,278,135. However, the position of the excitation and emission bands of theses aluminates is not optimum. They have to be excited by short UV in the range of 330 to 400 nm.

New interesting luminescent materials are α-sialon materials doped with $Eu^{2+}$. They have the structure $M_tSi_{12-(m+n)}Al_{(m+n)}O_nN_{(16-n)}$ with M is Ca or Y or rare earth metal. The value t is given as m/val+, wherein val+ is the charge of the valence of the ion M. For example, the val+ value of $M=Sr^{2+}$ is 2. Thus the charge of the whole structure is fully compensated. For further details see for example "Luminescence properties of Tb, Ce, or Eu-Doped α-Sialon Materials" by J. van Krevel et al., J. Sol. St. Chem., April 2002, p. 19-24, and also "Preparation and Luminescence Spectra of Ca and rare Earth co-doped α-SiAlON Ceramics" by R.-J. Xie et al. in J. A. Ceram. Soc. 2002, p. 1229-1234, May 2002, and furtheron U.S.-Pub 2002/0043926, which references all deal with Ca-Sialon of the α-Sialon type. Other types of sialon were not known at this time.

DISCLOSURE OF THE INVENTION

It is an object of the present invention to provide a new luminescent material, preferably a phosphor for LED-applications. A further object is to provide a phosphor with a fine-tuned emission which can be efficiently excited by UV/blue radiation. A further object is to provide a phosphor for use in an illumination device with at least one LED as light source, the LED emitting primary radiation in the range from 360 to 470 nm, this radiation being partially or completely converted into longer-wavelength radiation by phosphors which are exposed to the primary radiation from the LED. A further object is to provide an illumination device which emits white light and in particular has a high color rendering. A further object is to provide a high-efficiency illumination device like a LED device which absorbs well in the range from 360 to 470 nm and is easy to produce.

These and other object are attained in accordance with one aspect of the invention directed to a luminescent material, preferably a phosphor for LED-applications, which is excitable in the UV-blue region from 360 to 470 nm. The luminescent material includes an Eu-doped host lattice with a general composition of $MAl_{2-x}Si_xO_{4-x}N_x$, wherein M is at least one of an alkaline earth metal selected from the group consisting of Ca, Sr, and Ba, with $0.002 \leq x \leq 1.5$, preferably $x \leq 0.7$, and with a proportion of Eu from 0.1 to 25% of M.

The conversion is achieved at least with the aid of an oxynitride phosphor which originates from the class of the Eu-activated or Eu, Mn-co activated aluminates. In more detail, the disadvantages of the prior art are overcome by incorporation of nitrogen in $MAl_2O_4$:Eu (M=Ca, Sr, or Ba), resulting in an oxynitride phosphor, usually and preferably maintaining the tridymite structure. However other structures are not excluded. More specifically, $(AlO)^+$ is partially replaced by $(SiN)^+$ giving the general composition: $MAl_{2-x}Si_xO_{4-x}N_x$:(Eu or Eu,Mn). The value x is set as $x \geq 0.002$ and at most x=1.5. In contrast to the afore mentioned prior-art α-sialon type structures, which are derived from the nitride $Si_3N_4$, the structure here is more oxide-like, derived from a $SiO_2$ modification, and more specifically preferably derived from a tridymite structure.

In contrast, α-sialon materials show a so-called nitridic structure, in other words they are based on $Si_3N_4$ wherein Si—N is partially replaced by Al—O and/or by Al—N. These different structures result in a different luminescent behavior since possible activator sites in alpha-sialons and tridymites strongly differ in the local interaction with the surrounding ions.

In case of Ca as main component of M a preferred value is $0.01 \leq x \leq 0.1$. In case of Ba or Sr as main component of M a preferred value is $0.1 \leq x \leq 0.7$. The incorporation of nitrogen increases the degree of covalent bonding and ligand-field splitting. As a consequence this leads to a shift of excitation and emission bands to longer wavelengths compared to oxide lattices. The obtained phosphors show high chemical and thermal stability. More extended fine tuning of all relevant properties can be obtained by use of a cation M which is achieved by combining several of said M metals (especially Sr and Ba), by further inclusion of Zn as part of cation M (preferably 10-40 mol-%), and/or at least partial replacement of Si by Ge (preferably 5-25 mol %) and/or Al by Ga (preferably 5-25 mol %). Preferably, the metal M is mainly Ba and/or Sr for a green-emitting material, and mainly Ca for a blue-emitting material. The amount of Eu doped to cation M is between 0.1 and 25%, preferably between 2 and 15% of M. In addition further doping with Mn for fine-tuning of relevant properties is possible with an preferred amount of at most 50% of the Eu doping.

A light source can be formed comprising a luminescent material described herein. In the light source, a primary emitted radiation is UV. The luminescent material is combined with an additional phosphor in order to convert the primary emitted radiation into a secondary emitted light of longer wavelength resulting in emitting white light. In one example, the additional phosphor is a red emitting phosphor.

Since these materials can convert UV-blue radiation into blue-green light due to low-energy excitation bands, they can be applied for example in white light sources (e.g. lamps), especially sources based on primarily blue-emitting LEDs (typically GaN or InGaN with emission around 430 to 470 nm) combined with a red-emitting phosphor. A suitable red-emitting phosphor is a Eu-doped silicon nitride material, like $M_2Si_5N_8$ (M=Ca, Sr, or Ba), see for example U.S. Pat. No. 6,649,946. These materials may also be applied in colored light sources.

BRIEF DESCRIPTION OF THE DRAWINGS

In the text which follows, the invention is explained in more detail with reference to a plurality of exemplary embodiments. In the drawings.

BEST MODE FOR CARRYING OUT THE INVENTION

Figure 1A:
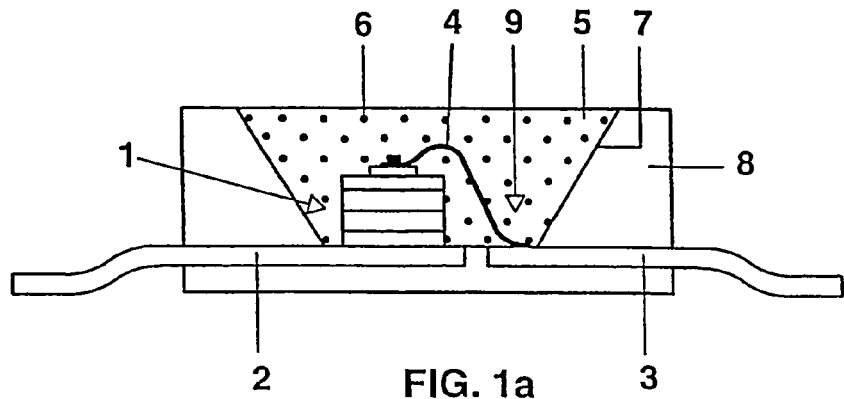
FIG. 1a shows a semiconductor component (LED) which serves as a light source for white light, with casting resin.

By way of example, a structure similar to that used in WO 01/40403 is described for use in a white LED together with an InGaN chip. The structure of such a light source for white light is specifically shown in FIG. 1a. The light source is based on a semiconductor component (chip 1) of type InGaN with a peak emission wavelength of 400 nm, having a first and a second electrical connection 2,3, which is embedded in an opaque base housing 8 in the region of a recess 9. One of the connections 3 is connected to the chip 1 via a bonding wire 4. The recess has a wall 7 which serves as reflector for the blue primary radiation of the chip 1. The recess 9 is filled with a potting compound 5 which contains a silicone casting resin (or epoxy casting resin) as its main constituents (pref. more than 80 by weight) and further comprises phosphor pigments 6 (pref. less than 15% by weight). There are also further small amounts of, inter alia, methyl ether and Aerosil. The phosphor pigments are a mixture of three pigments which emit blue, green and red light with the green phosphor being in accordance with the invention.

Figure 1B:
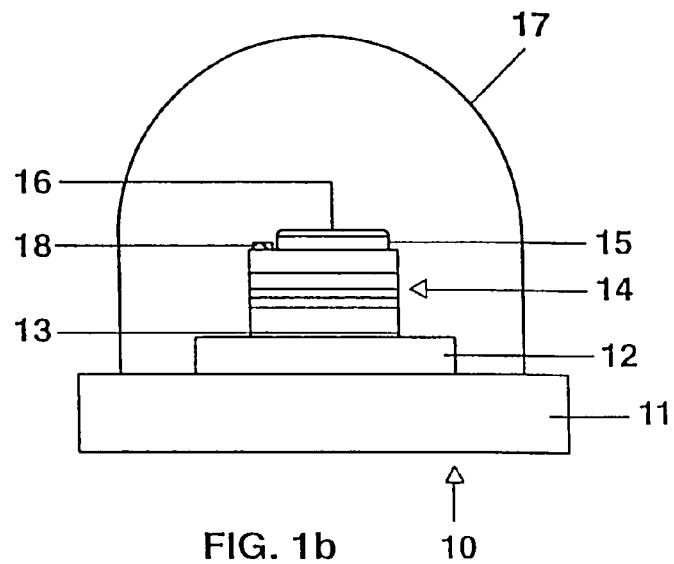
FIG. 1b shows an LED, without casting resin

FIG. 1b shows an embodiment of a light source with a semiconductor component 10 in which the conversion into white light is effected by means of phosphor conversion layers 16 which are applied directly to the individual chip. On top of a substrate 11 there are a contact layer 12, a mirror 13, a LED chip 14, a filter 15 and a phosphor layer 16, which is excited by the primary radiation of the LED, and converts it into visible long-wave radiation. This structural unit is surrounded by a plastic lens 17. Only the upper contact 18 of the two ohmic contacts is illustrated. Primary UV radiation of the LED is around 400 nm and secondary radiation is emitted by a first phosphor in accordance with the invention $M_{(1-c)}Al_{2-x}Si_xO_{4-x}N_x:D_c$ with D being Eu or Eu, Mn. Especially preferred is using $BaAl_{2-x}Si_xO_{4-x}N_x$: (10%) $Eu^{2+}$, emitting around 525 nm (or in the language of the a.m. general formula c=0.1 and D=Eu), and by a second phosphor using a Nitrido-silicate emitting orange-red.

Figure 2:
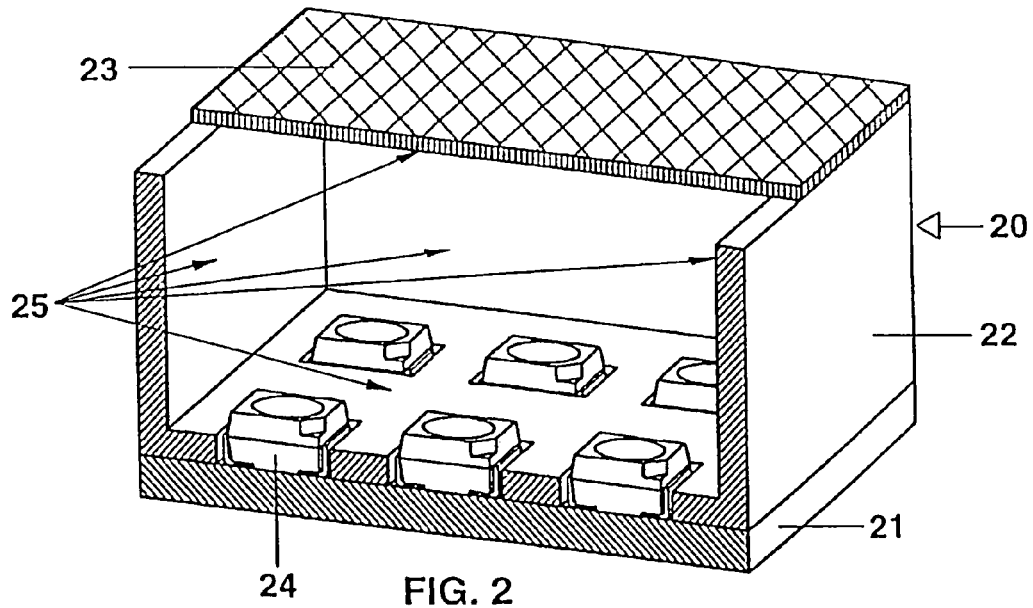
FIG. 2 shows an illumination device with phosphors in accordance with the present invention.

FIG. 2 shows an illumination device 20. It comprises a common support 21, to which a cubical outer housing 22 is adhesively bonded. Its upper side is provided with a common cover 23. The cubical housing has cutouts in which individual semiconductor components 24 are accommodated. They are blue emitting light-emitting diodes with a peak emission of around 450 to 470 nm. The conversion into white light takes place by means of conversion layers 25 which are arranged on all the surfaces which are accessible to the blue radiation. These include the inner surfaces of the side walls of the housing, of the cover and of the support. The conversion layers 25 consist of phosphors which emit in the red spectral region, and in the green spectral region using a phosphor according to the invention and mixing up together with the non-absorbed part of the primary radiation blue primary into white light.

$Eu_2O_3$ (with purity 99.99%), $BaCO_3$ (with purity >99.0%), $SrCO_3$ (with purity >99.0%), $CaCO_3$ (with purity >99.0%), $Al_2O_3$ (with purity 99.9%), $SiO_2$ and $Si_3N_4$ were used as commercially available starting materials for the production of the new inventive phosphors. The raw materials were homogeneously wet-mixed in the appropriate amounts by a planetary ball mill for 4-5 hours in isopropanol. After mixing the mixture was dried in a stove and ground in an agate mortar. Subsequently, the powders were fired in molybdenum crucibles at 1100-1400° C. under a reducing nitrogen/hydrogen atmosphere in a horizontal tube furnace. After firing, the materials were characterized by powder X-ray diffraction (copper K-alpha line).

Figure 3:
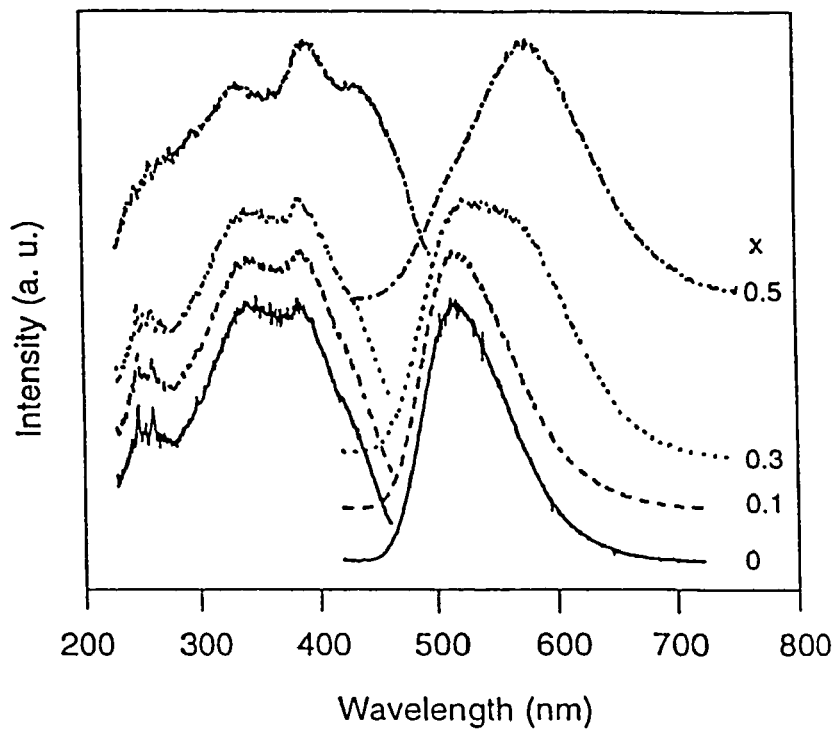
FIG. 3 shows the emission spectrum and reflection spectrum of a phosphor in accordance with the present invention.
Figure 4:
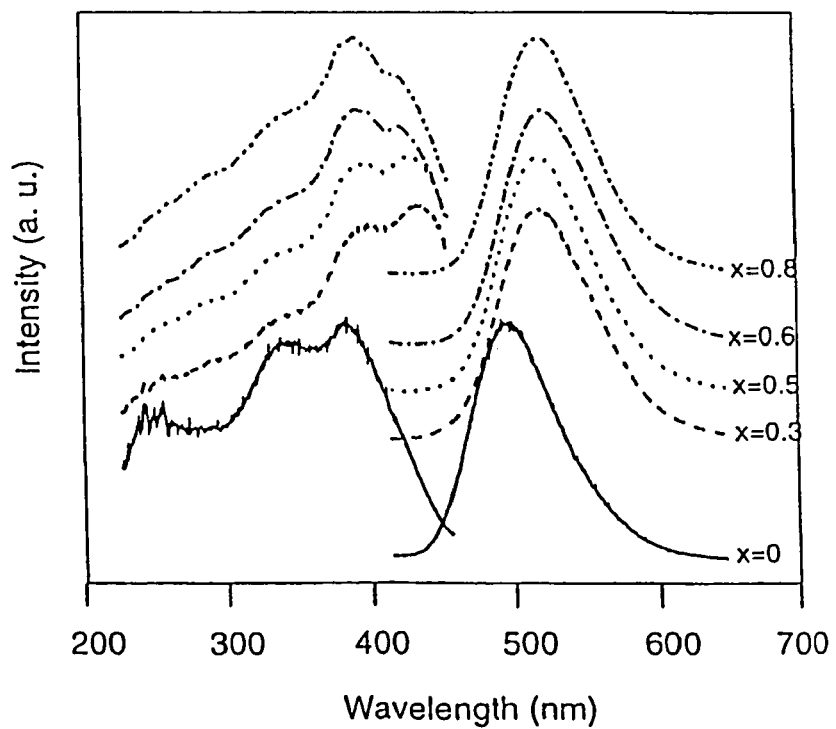
FIGS. 4 to 8 show the emission spectra and reflection spectra of further phosphors in accordance with the present invention.

All samples show efficient luminescence under UV-blue excitation with emission maxima in the blue (in case of M=Ca), especially 435 to 445 nm, or green (for M=Sr or Ba), especially in case of Ba 495 to 530 nm and in case of Sr 515 to 575 nm. Two typical examples of emission and excitation spectra can be seen in FIG. 3 and FIG. 4. FIG. 3 shows emission spectra and excitation spectra of $SrAl_{2-x}Si_xO_{4-x}N_x$:Eu with varying value of x. FIG. 4 shows emission/excitation spectra of $BaAl_{2-x}Si_xO_{4-x}N_x$:Eu with varying value of x.

By varying the amount of nitrogen, the emission can be shifted in the range 495-575 nm. Esp. Sr is sensitive to shifting (FIG. 3), while the top of the excitation band can be shifted from below 400 nm up till 430 to 465 nm, preferably to 440 nm, see M=Ba (FIG. 4). The observed shift to higher wavelengths is the result of a center of gravity of the Eu 5d band at lower energy and a stronger ligand-field splitting of the Eu 5d band.

Additional fine tuning can be achieved by incorporation of Zn as an addition to cation M, preferably not more than 30%, and at least partial replacement of Al by Ga, preferably not more than 25%, and/or Si by Ge, preferably not more than 25%.

TABLE 1

| Raw materials | Grade |
|---|---|
| $MCO_3$ (M = Ca, Sr, Ba) | 99.0% |
| $SiO_2$ | Aerosil OX50 |
| $\gamma$-$Al_2O_3$ | >99.995 |
| $Si_3N_4$ | β content: 23.3%, O~0.7% |
| $Eu_2O_3$ | 99.99% |

In the following the synthesis procedures for $MAl_{2-x}Si_xO_{4-x}N_x$:(10%) Eu2+ (M=Ca, Sr, or Ba) are given. Possible starting materials are shown in table 1.

All the oxynitride phosphors including tridymite are synthesized according to the following reaction equation (gas phases neglected):

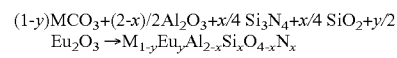

with M=Ca, Sr, or Ba alone or in combination. An example is y=0.1.

For example, the compositions of $Ba_{0.9}Eu_{0.1}Al_{2-x}Si_xO_{4-x}N_x$ are shown in the following table 2.

TABLE 2

(Unit: gram)

| x value | $BaCO_3$ | $Al_2O_3$ | $Si_3N_4$ | $SiO_2$ | $Eu_2O_3$ |
|---|---|---|---|---|---|
| 0.3 | 3.497 | 1.689 | 0.205 | 0.088 | 0.343 |
| 0.5 | 3.500 | 1.492 | 0.342 | 0.146 | 0.343 |

The detailed experimental results showed that the luminescence properties of the phosphors were almost independent of exact $SiO_2$ content. However, reducing $SiO_2$ content in an appropriate amount (i.e., it can be reduced up to 1/60 of the calculated amount $SiO_2$) strongly increases phase purity as well as efficiency.

The powder mixture is fired for several hours in Mo crucibles at 1100-1400° C. in a reducing atmosphere of $N_2$ with a small amount of $H_2$ (10%) in the horizontal tube furnaces.

Further excitation and emission spectra of samples elucidating the role of $SiO_2$ reduction are shown in FIGS. 5 to 8.

Figure 5:
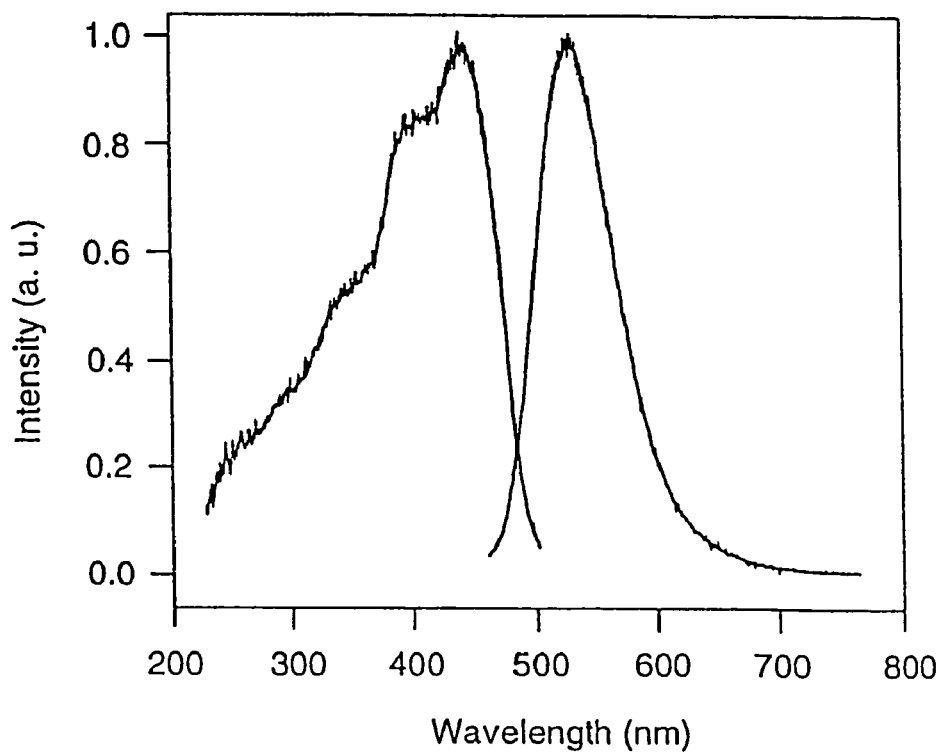

Embodiment according to FIG. 5: $Ba_{0.9}Eu_{0.1}Al_{2-x}Si_xO_{4-x}N_x$ with x=0.3 and no $SiO_2$ reduction. The phosphor was excited with $\lambda_{exc}$=440 nm for the emission spectrum and monitored at $\lambda_{mon}$=530 nm for the excitation spectrum. Its main phase has $BaAl_2O_4$ structure.

Figure 6:
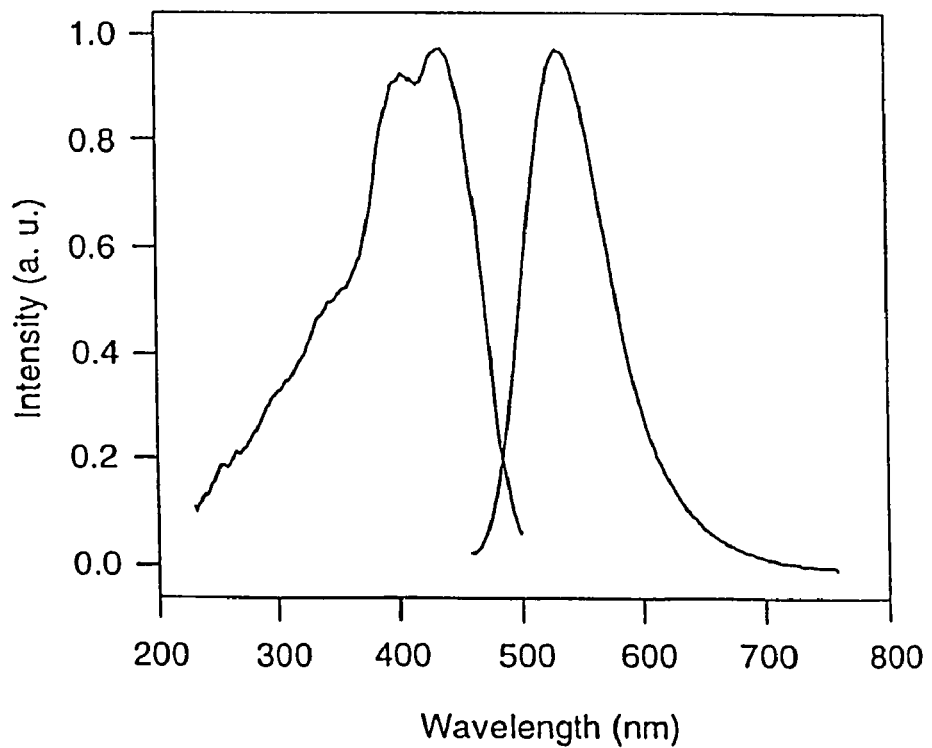

Embodiment according to FIG. 6: $Ba_{0.9}Eu_{0.1}Al_{2-x}Si_xO_{4-x}N_x$ with x=0.3, $SiO_2$ amount reduced to one-fourth of calculated $SiO_2$ amount ($\lambda_{exc}$=440 nm, $\lambda_{mon}$=530 nm). Its main phase has $BaAl_2O_4$ structure.

Figure 7:
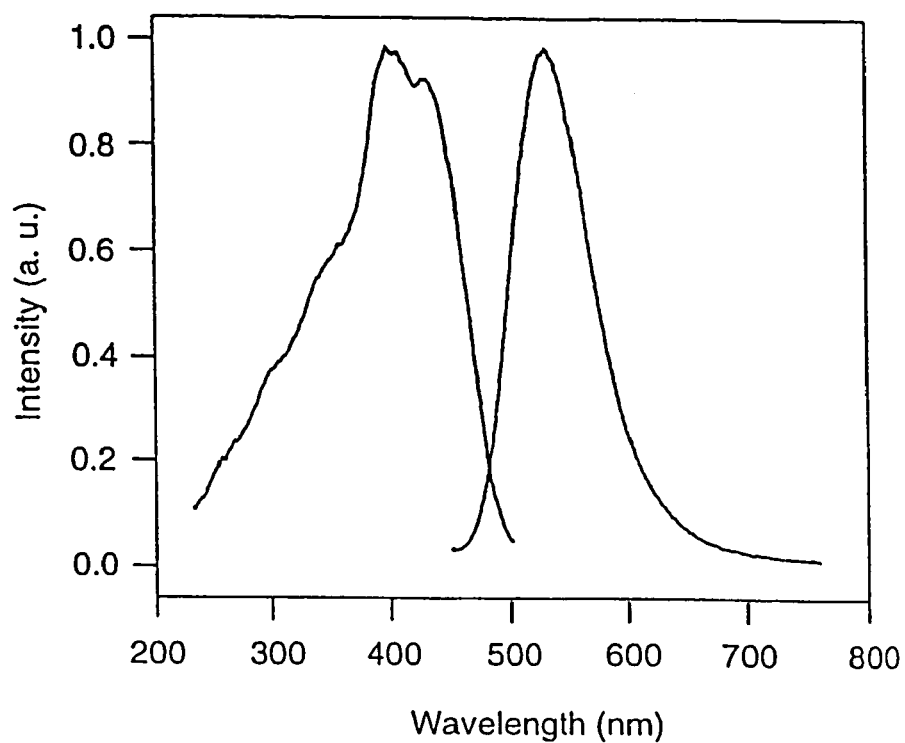

Embodiment according to FIG. 7: $Ba_{0.9}Eu_{0.1}Al_{2-x}Si_xO_{4-x}N_x$ with x=0.5 and $SiO_2$ amount reduced to 1/16 of calculated $SiO_2$ amount ($\lambda_{exc}$=440 nm, $\lambda_{mon}$=530 nm). Its main phase has $BaAl_2O_4$ structure.

$Si_3N_4$ was used as the source of $(SiN)^+$ according to the following reaction [1]:

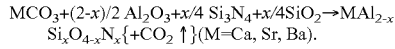

$MCO_3 + (2-x)/2\, Al_2O_3 + x/4\, Si_3N_4 + x/4SiO_2 \rightarrow MAl_{2-x}Si_xO_{4-x}N_x\{+CO_2\uparrow\}$ (M=Ca, Sr, Ba).

Figure 9:
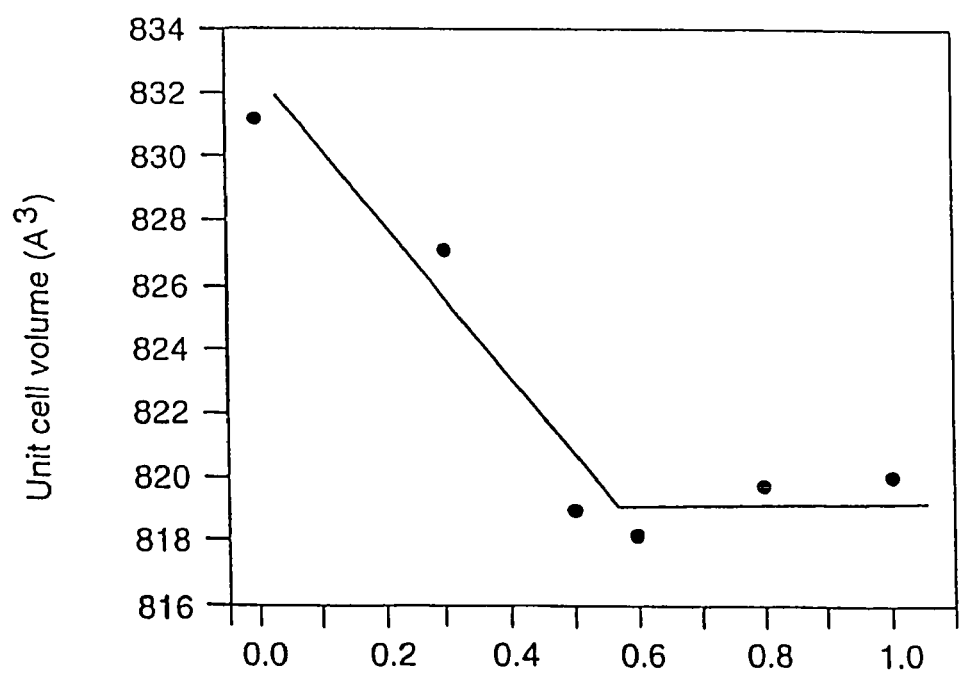
FIG. 9 shows the relationship between the volume of a unit cell and the value of x.

With the atomic radius decreasing from Ba to Ca it was found that the replacement of $(AlO)^+$ by $(SiN)^+$ by this reaction became more difficult. Lattice parameters results show that the maximum solubility of N in $BaAl_2O_4$ with tridymite structure was about x≈0.6. FIG. 9 shows the relationship between unit cell volume and x values of $BaAl_{2-x}Si_xO_{4-x}N_x$ with tridymite structure. As expected, from the smaller Si—N distance as compared to the Al—O distance, the unit cell volume decreases with increasing x as shown in FIG. 9. For x values remarkably larger than 0.6, the unit cell volume remains almost constant, and secondary phases are observed.

So, good results can be achieved with Ba aluminate and with x up to about 0.6 without the need to adapt the $SiO_2$ amount.

Also good results are seen with Sr aluminate. Reduction (expressed as amount y) of the $SiO_2$ content results in an non-stoichiometric aluminate of the type $MAl_{2-x}Si_{x-y}O_{4-x-2y}N_x$:Eu, preferably with y≦0.25x. Best performance is achieved with $SiO_2$ correction, and with x up to 0.5. The same holds true for Ca aluminate, however smaller x values are preferred below 0.05.

Figure 8A:
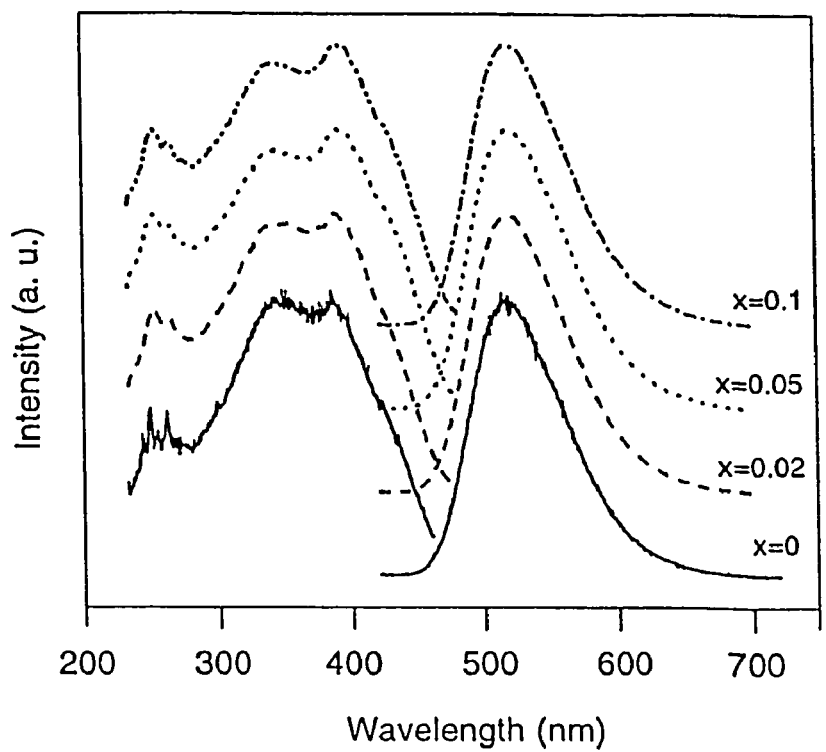
Figure 8B:
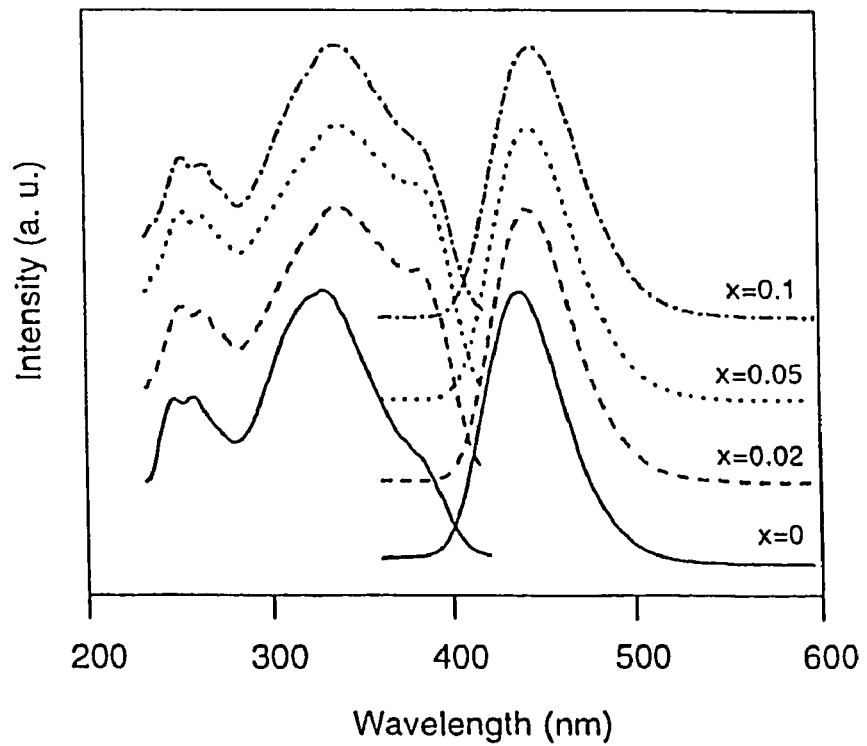

The luminescence properties of $MAl_{2-x}Si_xO_{4-x}N_x$:10% $Eu^{2+}$ are now discussed in more detail. FIG. 8 shows the excitation and emission spectra of $MAl_{2-x}Si_xO_{4-x}N_x$:$Eu^{2+}$ (M=Sr, Ca). The $SiO_2$ content is not reduced. In more detail, FIG. 8a shows excitation and emission spectra of $SrAl_{2-x}Si_xO_{4-x}N_x$:$Eu^{2+}$ (10%) and FIG. 8b excitation and emission spectra of $CaAl_{2-x}Si_xO_{4-x}N_x$:$Eu_{2+}$ (10%), each with various x.

Corresponding to the results of the relationship between unit cell volume and x values of $MAl_{2-x}Si_xO_{4-x}N_x$, the emission bands shift more or less to the longer wavelength depending on the cation. In case of Ba the shift is typically from 495 to 530 nm, in case of Sr the shift is typically from 515 to 575 nm and in case of Ca the shift is typically from 440 to 445 nm. For $BaAl_{2-x}Si_xO_{4-x}N_x$: (10%) $Eu^{2+}$, the emission band shifts from about 497 to 527 nm with increasing content x of incorporated nitrogen. The position of the excitation band shifts accordingly from 385 to 425 nm.

For $MAl_{2-x}Si_xO_{4-x}N_x$: (10%)$Eu^{2+}$, with M is at least one of Sr or Ca, the amount of $(SiN)^+$ does not essentially increase the emission and excitation wavelengths because almost no shift in the lattice parameters is observed. The maximum shift of emission bands of Eu is less than 10 nm corresponding to the fact of small nitrogen incorporation in case of M=Ca. Therefore, a small amount of $(SiN)^+$ incorporation can only exert weak influence to the local coordination of the $Eu^{2+}$ ion. This discussion is understood with the addition of the normal stoichiometric amount of $SiO_2$.

However, it turned out very surprisingly that the use of understoichiometric amount of $SiO_2$ is advantageous in several cases. The effect of an reduced amount of $SiO_2$ in the reaction (1) to the incorporation of N and to the luminescence properties is most pronounced in the case of $SrAl_{2-x}Si_xO_{4-x}N_x$:$Eu^{2+}$ (10%). The reason is not yet fully understood. When the amount of $SiO_2$ which should be used in reaction (1) is taken about a factor 60 lower, it is found that an increased amount of $(SiN)^+$ is incorporated into $SrAl_2O_4$ lattice with stuffed tridymite structure. The maximum solubility is x≈0.5 (Table 1). As a result of N incorporation the Eu emission bands shift to longer wavelengths, up to 575 nm (FIG. 3). An evident excitation shoulder at 430 nm appears at the maximum solubility of nitrogen (x=0.3 . . . 0.5), as shown in FIG. 3.

Instead of a structure derived from tridymite, also a structure derived from the structure of $SrSiAl_2O_3N_2$ is possible. This compound was discovered by Schnick in 1998. It is isotopic with silicate nitrides of the type $LnSi_3N_5$ (with Ln=La, Ce, Pr, or Nd).

The invention is not restricted by the description of the invention on the basis of the exemplary embodiments. Rather, the invention encompasses any new feature and also any combination of features, which comprises in particular any combination of features in the patent claims, even if this combination is not explicitly specified in the patent claims.

What is claimed is:

1. A luminescent material excitable in the UV-blue region from 360 to 470 nm, the luminescent material comprising a Eu-doped host lattice with a general composition of $MAl_{2-x}Si_xO_{4-x}N_x$,
  wherein M is at least one of an alkaline earth metal selected from the group consisting of Ca, Sr, and Ba, with 0.002≦x≦1.5 and with a proportion of Eu from 0.1 to 25% of M.

2. The luminescent material according to claim 1, wherein the host lattice is derived from a tridymite structure.

3. The luminescent material according to claim 1, wherein M is at least one of Strontium and Barium in order to achieve green emission.

4. The luminescent material according to claim 1, wherein M is Calcium in order to achieve blue emission.

5. The luminescent material according to claim 1, wherein M is a mixture of at least two alkaline earth metals selected from the group consisting of Ca, Sr, and Ba.

6. The luminescent material according to claim 1, wherein M comprises Zn.

7. The luminescent material according to claim 1, wherein Al is replaced fully by Ga.

8. The luminescent material according to claim 1, wherein Si is replaced fully by Ge.

9. The luminescent material according to claim 1, wherein the host material is further doped with Mn.

10. A light source comprising a luminescent material according to claim 1.

11. A light source comprising a luminescent material according to claim 1, wherein a primary emitted light is blue and the luminescent material is combined with an additional phosphor, in order to convert part of the primary emitted light into a secondary emitted light of longer wavelength resulting in emitting white light.

12. A light source comprising a luminescent material according to claim 1, wherein a primary emitted radiation is UV and the luminescent material is combined with an additional phosphor in order to convert the primary emitted radiation into a secondary emitted light of longer wavelength resulting in emitting white light.

13. The light source according to claim 10, wherein the light source comprises at least one LED.

14. The light source according to claim 11, wherein the additional phosphor is a red emitting phosphor.

15. The light source according to claim 12, wherein the luminescent material is a blue emitting phosphor and the additional phosphor is a red emitting phosphor.

16. The luminescent material according to claim 1, wherein x is below 0.7.

17. The luminescent material according to claim 1, wherein M comprises Zn up to 40 mol-%.

18. The luminescent material according to claim 1, wherein Al is replaced partially by Ga.

19. The luminescent material according to claim 1, wherein Si is replaced partially by Ge of not more than 25%.

20. The luminescent material according to claim 1, wherein the host material is further doped with Mn in an amount of up to 50% of the Eu doping.

* * * * *

UNITED STATES PATENT AND TRADEMARK OFFICE
CERTIFICATE OF CORRECTION

PATENT NO. : 7,485,243 B2  Page 1 of 1
APPLICATION NO. : 10/496560
DATED : February 3, 2009
INVENTOR(S) : Hubertus T. Hintzen It is certified that error appears in the above-identified patent and that said Letters Patent is hereby corrected as shown below:

On the Title page, insert the following:

--(30)    Foreign Application Priority Data

EP 02021177.7              Sept. 24, 2002--

Signed and Sealed this
Fifth Day of January, 2016

Michelle K. Lee
*Director of the United States Patent and Trademark Office*